(12) United States Patent
Hidaka et al.

(10) Patent No.: US 9,379,272 B2
(45) Date of Patent: Jun. 28, 2016

(54) LIGHT RECEIVING ELEMENT AND OPTICALLY COUPLED INSULATING DEVICE

(71) Applicant: Kabushiki Kaisha Toshiba, Minato-ku, Tokyo (JP)

(72) Inventors: Miki Hidaka, Kanagawa-ken (JP); Osamu Takata, Kanagawa-ken (JP); Masahito Nishigoori, Tokyo (JP); Yukiko Takiba, Fukuoka-ken (JP); Hiroshi Suzunaga, Fukuoka-ken (JP); Hiroshi Shimomura, Oita-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/203,114

(22) Filed: Mar. 10, 2014

(65) Prior Publication Data
US 2015/0076526 A1 Mar. 19, 2015

(30) Foreign Application Priority Data
Sep. 13, 2013 (JP) .................................. 2013-190503

(51) Int. Cl.
| | |
|---|---|
| H01L 31/167 | (2006.01) |
| H01L 31/0216 | (2014.01) |
| H01L 31/14 | (2006.01) |
| H01L 31/02 | (2006.01) |
| H01L 31/103 | (2006.01) |
| H01L 31/16 | (2006.01) |

(Continued)

(52) U.S. Cl.
CPC ............ *H01L 31/167* (2013.01); *H01L 23/552* (2013.01); *H01L 25/167* (2013.01); *H01L 27/1446* (2013.01); *H01L 31/02005* (2013.01); *H01L 31/02016* (2013.01); *H01L 31/02162* (2013.01); *H01L 31/103* (2013.01); *H01L 31/14* (2013.01); *H01L 31/165* (2013.01)

(58) Field of Classification Search
CPC ............ H01L 31/02005; H01L 31/167; H01L 27/14636; H01L 27/14623; H01L 25/167; H01L 25/552; H01L 31/16; H01L 31/02162
See application file for complete search history.

(56) References Cited

U.S. PATENT DOCUMENTS 7,482,646 B2 * 1/2009 Gao et al. ....................... 257/292
8,022,403 B2 9/2011 Matsumae
(Continued)

FOREIGN PATENT DOCUMENTS

| JP | 03-050777 A | 3/1991 |
|---|---|---|
| JP | 04-106985 A | 4/1992 |

(Continued)

OTHER PUBLICATIONS

Japanese Office Action issued on Dec. 25, 2015 in corresponding Japanese Application No. 2013-190503, along with English translation thereof.

*Primary Examiner* — Alonzo Chambliss
(74) *Attorney, Agent, or Firm* — White & Case LLP

(57) ABSTRACT

A light receiving element includes: a semiconductor layer; an insulating layer; an interconnect layer; and a film. The semiconductor layer includes a light receiving unit configured to convert a signal light incident on the light receiving unit into an electrical signal. The insulating layer is provided on the semiconductor layer. The interconnect layer is provided on the insulating layer. The film is provided on the insulating layer to cover the light receiving unit and be connected to the interconnect layer, the film being made of a metal or a metal nitride.

11 Claims, 7 Drawing Sheets

(51) Int. Cl.
*H01L 27/144* (2006.01)
*H01L 23/552* (2006.01)
*H01L 25/16* (2006.01)

(56) References Cited

U.S. PATENT DOCUMENTS

| | | | | |
|---|---|---|---|---|
| 8,445,827 | B2* | 5/2013 | Mizuta | H01L 27/14632 250/208.1 |
| 8,946,797 | B2* | 2/2015 | Mizuta | H01L 27/1464 257/233 |
| 8,987,852 | B2* | 3/2015 | Okabe | H01L 27/14641 257/432 |
| 2007/0210395 | A1* | 9/2007 | Maruyama et al. | 257/431 |
| 2008/0135897 | A1* | 6/2008 | Huang | H01L 27/14621 257/292 |
| 2008/0254554 | A1* | 10/2008 | Kitamura | 438/7 |
| 2009/0185060 | A1* | 7/2009 | Akiyama | 348/294 |
| 2010/0025675 | A1 | 2/2010 | Yamazaki et al. | |
| 2010/0102410 | A1 | 4/2010 | Shimizu et al. | |
| 2010/0201834 | A1* | 8/2010 | Maruyama et al. | 348/222.1 |
| 2012/0133010 | A1* | 5/2012 | Komukai | H01L 27/1463 257/432 |
| 2012/0273779 | A1 | 11/2012 | Yamazaki et al. | |
| 2013/0037902 | A1* | 2/2013 | Nakazawa | H01L 27/14627 257/432 |
| 2014/0043497 | A1* | 2/2014 | Tanikuni | H01L 27/146 348/222.1 |
| 2014/0151840 | A1* | 6/2014 | Cheng | H01L 27/14636 257/460 |
| 2015/0060850 | A1 | 3/2015 | Yamazaki et al. | |

FOREIGN PATENT DOCUMENTS

| | | |
|---|---|---|
| JP | 04-324686 A | 11/1992 |
| JP | 4-373181 A | 12/1992 |
| JP | H11-135824 A | 5/1999 |
| JP | 2008-028473 A | 2/2008 |
| JP | 2010-103378 A | 5/2010 |
| JP | 2013-016714 A | 1/2013 |
| JP | 2013-168651 A | 8/2013 |

* cited by examiner

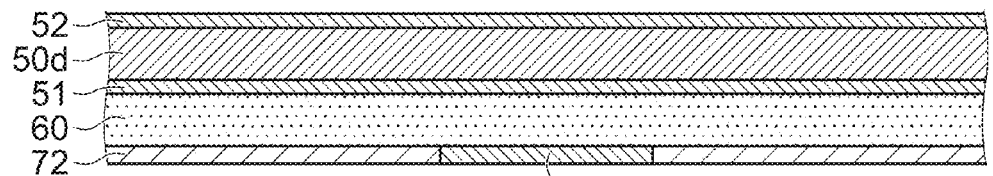
FIG. 9A
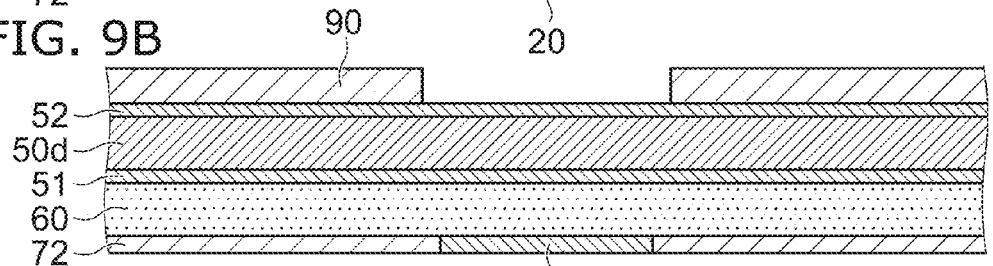
FIG. 9B
FIG. 9C
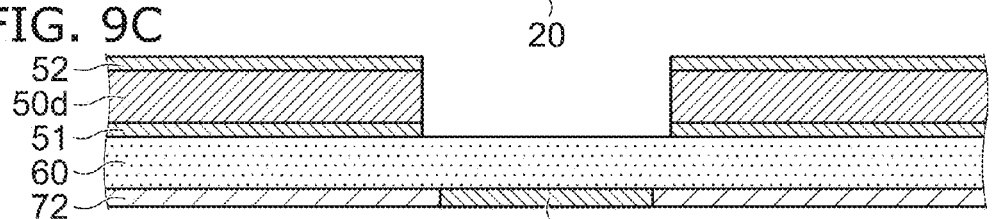
FIG. 9D
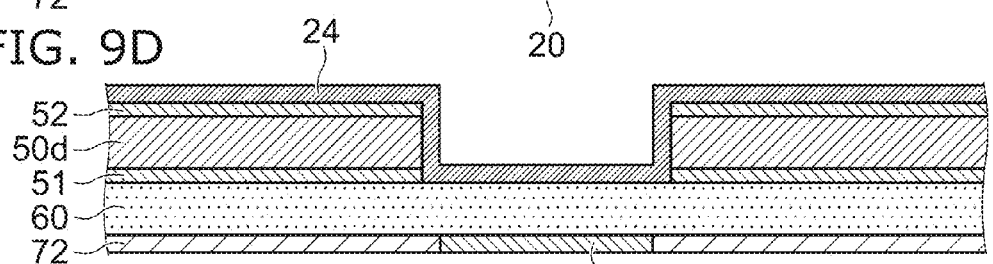
FIG. 9E
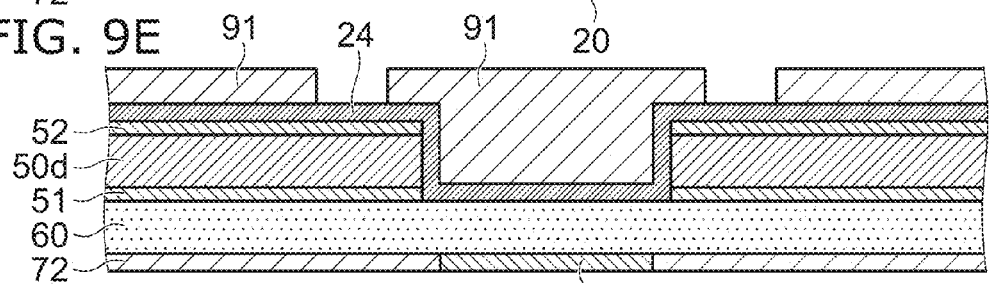
FIG. 9F
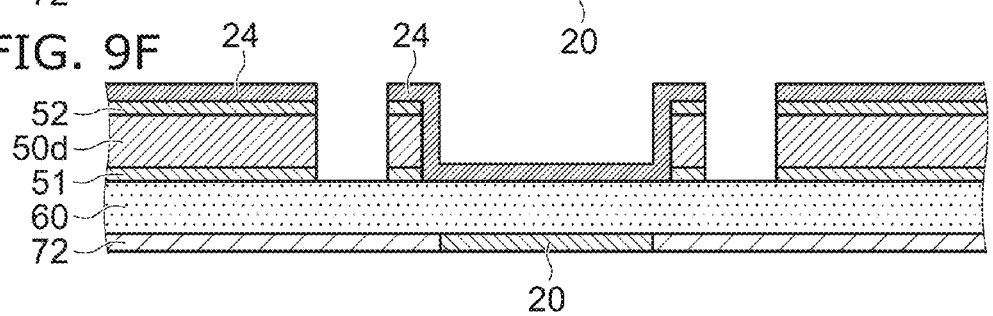

LIGHT RECEIVING ELEMENT AND OPTICALLY COUPLED INSULATING DEVICE

CROSS-REFERENCE TO RELATED APPLICATIONS

This application is based upon and claims the benefit of priority from Japanese Patent Application No. 2013-190503, filed on Sep. 13, 2013; the entire contents of which are incorporated herein by reference.

FIELD

Embodiments described herein relate generally a light receiving element and an optically coupled insulating device.

BACKGROUND

In many industrial electronic devices, communication devices, and the like, different power supply systems such as an AC power supply system, a DC power supply system, a telephone line system, etc., are disposed inside the same device to transmit an electrical signal.

In such a case, operations can be stable and safety can be ensured by using an optically coupled insulating device that can transmit the electrical signal in a state in which the input circuit and the output circuit are insulated from each other.

When a high voltage of 1 kV or more is applied between the input terminal and the output terminal of such an optically coupled insulating device, a noise component may occur in the light receiving element due to the electrostatic capacitance of an insulating layer between the input terminal and the output terminal.

Such noise can be reduced by covering the light receiving element with an electromagnetic shield film made of ITO (Indium Tin Oxide), a metal thin film having a mesh configuration, etc. However, it is difficult to improve the suitability for mass production of such an electromagnetic shield film in the manufacturing processes of the light receiving element.

BRIEF DESCRIPTION OF THE DRAWINGS

FIGS. 9A to 9F are schematic views showing a modification of the manufacturing processes of the electromagnetic shield film including the metal nitride thin film.

DETAILED DESCRIPTION

In general, according to one embodiment, a light receiving element includes: a semiconductor layer; an insulating layer; an interconnect layer; and a film. The semiconductor layer includes a light receiving unit configured to convert a signal light incident on the light receiving unit into an electrical signal. The insulating layer is provided on the semiconductor layer. The interconnect layer is provided on the insulating layer. The film is provided on the insulating layer to cover the light receiving unit and be connected to the interconnect layer, the film being made of a metal or a metal nitride.

Embodiments of the invention will now be described with reference to the drawings.

Figure 1:
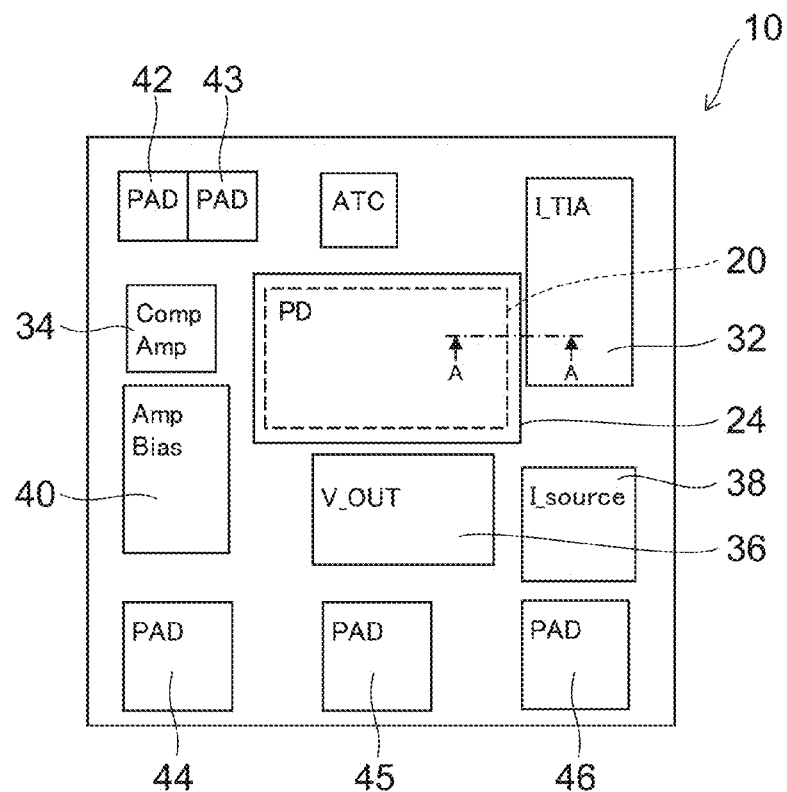
FIG. 1 is a schematic plan view of a light receiving element according to a first embodiment.

FIG. 1 is a schematic plan view of a light receiving element according to a first embodiment.

The light receiving element 10 includes a semiconductor substrate, a semiconductor layer provided on the semiconductor substrate, a metal interconnect layer, an insulating layer, and an electromagnetic shield film including a metal nitride thin film or a metal thin film.

The semiconductor layer includes a light receiving unit 20 that converts a signal light incident on the light receiving unit 20 into an electrical signal. The length of one side of one unit of the photodiodes included in the light receiving unit 20 may be 20 to 200 μm, etc.; and the units may be disposed in an array configuration or a mosaic array configuration.

The semiconductor layer may further include a signal processing circuit unit that processes and outputs the electrical signal. The signal processing circuit unit includes a TIA (a Transimpedance Amp) 32, a comparator 34, an output circuit 36, a current source 38, an amplifier bias circuit 40, etc. Also, the light receiving element 10 may include electrode pad units 42 to 46, etc.

Figure 2:
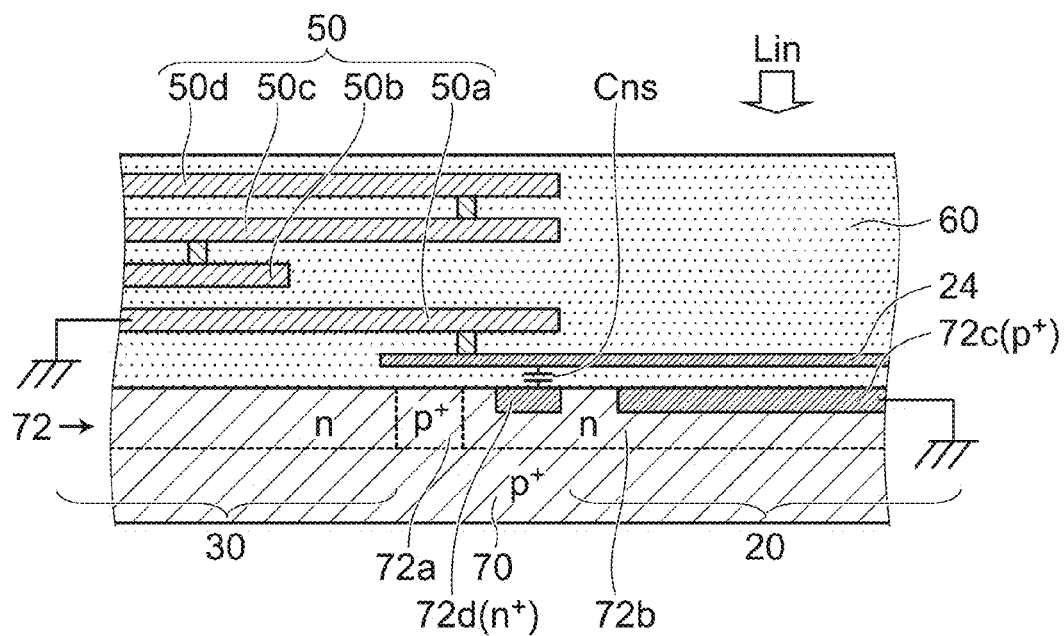
FIG. 2 is a schematic cross-sectional view of the light receiving element along line A-A of the light receiving element of the first embodiment.

FIG. 2 is a schematic cross-sectional view of the light receiving element along line A-A of the light receiving element of the first embodiment.

A semiconductor substrate 70 may be, for example, Si, SiC, etc. A semiconductor layer 72 that includes Si, etc., is provided on the semiconductor substrate 70 to include the light receiving unit 20 that converts a signal light Lin incident on the light receiving unit 20 into the electrical signal, and the signal processing circuit unit that processes and outputs the electrical signal. For example, the semiconductor substrate 70 is the p$^+$-type; and an n-type layer is provided on the semiconductor substrate 70. For example, a p$^+$-type layer 72a is formed by ion implantation, etc., from the front surface side to reach the semiconductor substrate 70 to separate the light receiving unit 20 from the signal processing circuit unit.

P-type layers and/or n-type layers are provided in the semiconductor layer 72 to form the signal processing circuit unit by forming MOS transistors and/or bipolar transistors. The light receiving unit 20 includes a high-resistance n-type layer 72b, a p$^+$-type layer 72c, an n$^+$-type layer 72d, etc. The conductivity types of the regions of the semiconductor substrate 70 and the semiconductor layer 72 may be the opposite of those of the structure of FIG. 2.

Metal interconnect layers 50 are provided at the upper portion of the semiconductor layer 72 to be connected respectively to the light receiving unit 20 and a signal processing circuit unit 30. In the case of metal interconnect layers 50a to 50d in which a plurality of layers are stacked with an insulating layer 60 interposed, the multiple layers are connected to the layers above and below at prescribed locations if necessary.

The insulating layer 60 is provided on the front surface of the semiconductor layer 72 to fill between the metal interconnect layers 50a to 50d. The insulating layer 60 may be, for example, a $SiO_x$ film, a $SiN_x$ film, a low relative dielectric constant (low k) film, etc.

A film (an electromagnetic shield film) 24 that includes a metal nitride thin film or a metal thin film covers a portion of the upper surface or the entire upper surface of the light receiving unit 20 with the insulating layer 60 interposed and is grounded via one of the metal interconnect layers 50. On the other hand, the anode or the cathode (in FIG. 2, the p$^+$-type anode) of the light receiving element 10 also is grounded. Thus, the electromagnetic shield effect can be increased.

Figure 3A:
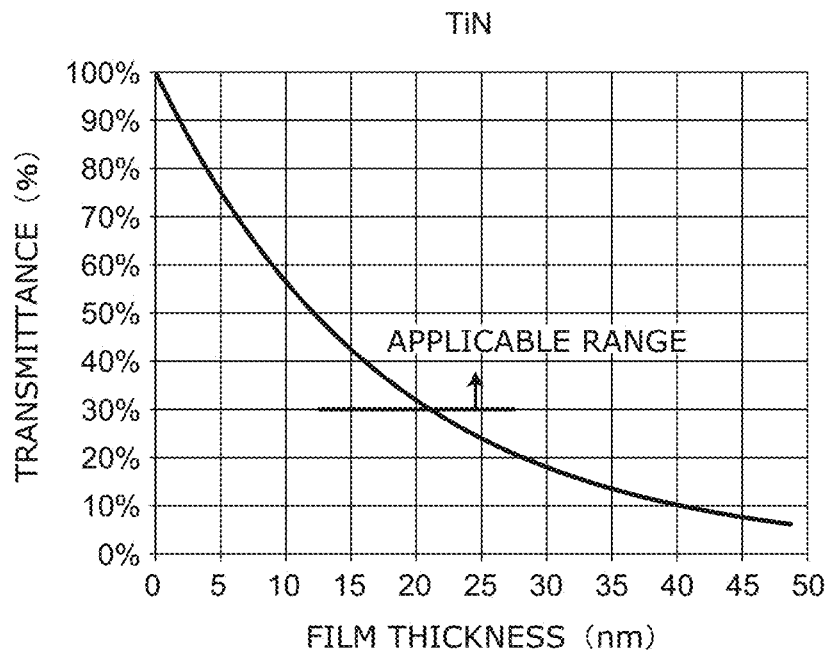
FIG. 3A is a graph showing the dependence of the transmittance on the thickness of the electromagnetic shield film.
Figure 3B:
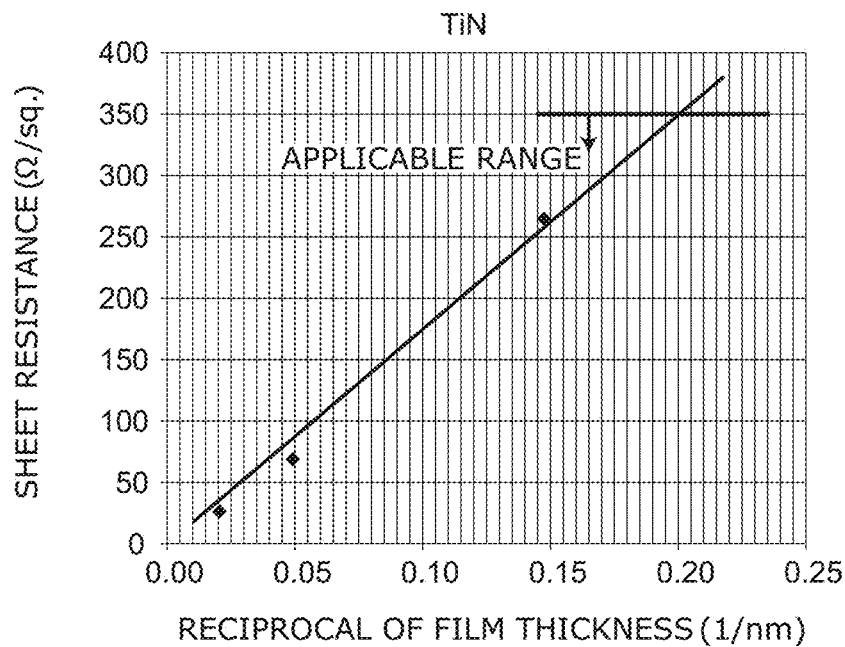
FIG. 3B is a graph showing the sheet resistance for the reciprocal of the thickness of the electromagnetic shield film.

FIG. 3A is a graph showing the dependence of the transmittance on the thickness of the electromagnetic shield film; and FIG. 3B is a graph showing the sheet resistance for the reciprocal of the thickness of the electromagnetic shield film.

In FIGS. 3A and 3B, the electromagnetic shield film is a metal nitride thin film made of TiN. In FIG. 3A, the vertical axis is the transmittance (%) of near-infrared light of 770 nm; and the horizontal axis is the thickness (nm) of the TiN film. The transmittance decreases to 50% when the film thickness is about 12 nm; and the transmittance decreases to 10% when the film thickness is about 40 nm.

In FIG. 3B, the vertical axis is the sheet resistance ($\Omega$/sq.); and the horizontal axis is the reciprocal (1/nm) of the film thickness. The electromagnetic shield effect increases as the sheet resistance decreases. By the evaluation of the common mode noise immunity described in detail below, the inventors discovered that misoperations due to the noise occurring due to a pulse voltage slope of 1 kV/µs can be reduced by setting the sheet resistance to be 350 $\Omega$/sq. or less (within the applicable range shown in FIG. 3B). In the case of TiN, the sheet resistance can be 350 $\Omega$/sq. or less by setting the film thickness to be 5 nm or more. In such a case, the electromagnetic shield film can be used in the light receiving element while maintaining a high transmittance of about 75%.

On the other hand, the sensitivity of the light receiving unit 20 decreases when the transmittance is lower than 30%. In other words, it is favorable for the film thickness to be 21 nm or less and the transmittance to be 30% or more (within the applicable range shown in FIG. 3A). In the case where the film thickness is 21 nm, the sheet resistance can be low, i.e., about 85 $\Omega$/sq.; and a high electromagnetic shield effect can be maintained.

The metal nitride thin film is not limited to TiN and may be TaN, ZrN, VN, NbN, etc. At 20° C., the resistivity value is 21.7 µ$\Omega$·cm for TiN, 135 µ$\Omega$·cm for TaN, 13.6 µ$\Omega$·cm for ZrN, 200 µ$\Omega$·cm for VN, and 200 µ$\Omega$·cm for NbN. In the case of Si, such metal nitride thin films can be used as a barrier layer that separates the metal interconnect layers from the Si to suppress the diffusion and/or migration of the metal. In other words, it is easy to use the metal nitride thin film in the manufacturing processes of the integrated circuit; and the productivity of the light receiving element 10 can be increased. Further, a metal thin film of Ti, Ta, W, Co, Ni, Al, Cu, etc., may be used as the electromagnetic shield film 24.

On the other hand, there are structures in which a transparent conductive film such as ITO (Indium Tin Oxide), a polycrystalline Si film, a mesh metal film, or the like is used as the electromagnetic shield film. In the case where ITO is used, the suitability for mass production degrades because a dedicated apparatus must be provided offline because the ITO film formation process is different from the manufacturing processes of the integrated circuit. Moreover, the reliability of ITO is insufficient because film breakage occurs easily at stepped portions. Further, the pattern dimensional precision and the patterning reproducibility are insufficient.

In the case of a polycrystalline Si film, the transmittance decreases radically near visible light; and light absorption of near-infrared light also occurs. In the case where the thickness is reduced to reduce the light absorption, the sheet resistance becomes high; and the wavelength dependence of the transmittance increases due to the high refractive index. Further, the film formation process of polycrystalline Si may exceed 500° C.; and it is difficult to form the polycrystalline Si on the metal interconnect layer.

In the case of a mesh metal film, the electromagnetic shield effect decreases drastically if the openings are too large; and if the mesh is fine, the sensitivity of the light receiving element is reduced because the incident light is reflected. Also, the suitability for mass production of the mesh formation process is insufficient.

Thus, the reliability and suitability for mass production are insufficient for an electromagnetic shield film made of a transparent conductive film, a polycrystalline Si film, or a mesh metal film. Conversely, it is easy to improve the characteristics and suitability for mass production of an electromagnetic shield film made of a metal nitride thin film.

Figure 4:
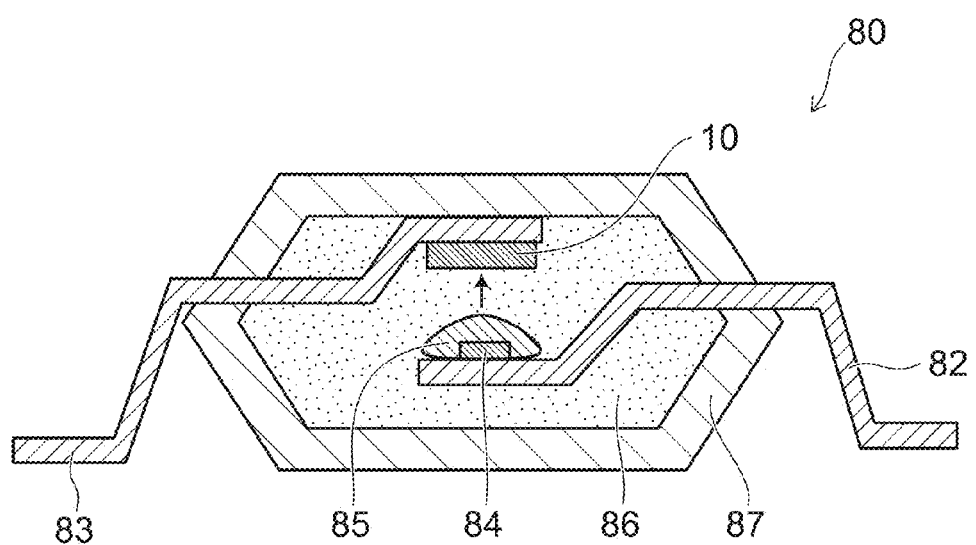
FIG. 4 is a schematic cross-sectional view of an optically coupled insulating device including the light receiving element of the first embodiment.

FIG. 4 is a schematic cross-sectional view of an optically coupled insulating device including the light receiving element of the first embodiment.

The optically coupled insulating device (including photocouplers and photorelays) 80 includes the light receiving element 10 of the first embodiment and a light emitting element 84 that is electrically insulated from the light receiving element 10 and irradiates near-infrared light toward the light receiving unit 20. If the light receiving element 10 is provided on a signal output unit, i.e., an output lead 83, and the light emitting element 84 is provided on a signal input unit, i.e., an input lead 82, an inner resin layer 86 and an outer resin layer 87 may be further provided around the light emitting element 84 and the light receiving element 10 which oppose each other. The light receiving element and the light emitting element may be provided on an insulating substrate and sealed with a resin layer.

Figure 5A:
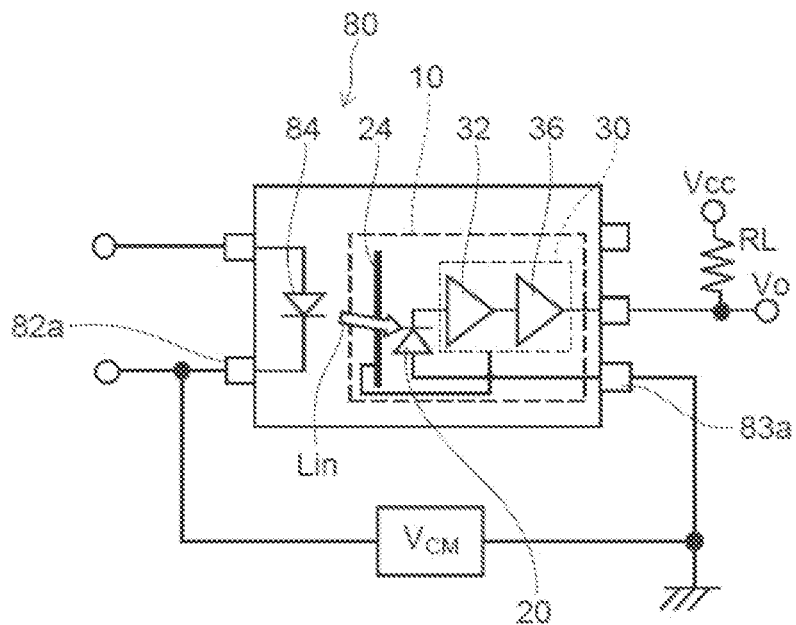
FIG. 5A is a schematic view showing a measurement system of the instantaneous common mode rejection voltage of the optically coupled insulating device.
Figure 5B:
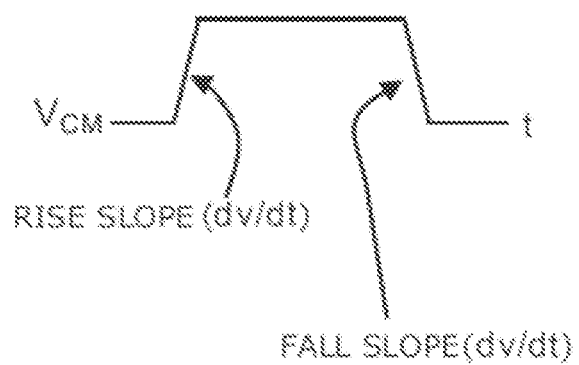
FIG. 5B is a waveform diagram showing the change of the pulse voltage.

FIG. 5A is a schematic view showing a measurement system of the instantaneous common mode rejection voltage of the optically coupled insulating device; and FIG. 5B is a waveform diagram showing the change of the pulse voltage.

In the optically coupled insulating device 80, the input lead 82 (the light emitting element 84 side) is insulated from the output lead 83 (the light receiving element 10 side). Therefore, there is a stray capacitance between the input lead 82 and the output lead 83. When a pulse voltage $V_{CM}$ that changes abruptly is applied between the input and output leads, a displacement current flows; and noise that causes misoperations occurs in an output voltage Vo of the light receiving element 10. The instantaneous common mode rejection voltage can be expressed as the common mode noise immunity (CMR (Common Mode Rejection)). In other words, a high CMR means that the noise immunity is high.

The CMR is measured as the change of the output voltage Vo of the light receiving element 10 when the pulse voltage $V_{CM}$ that changes abruptly is applied between an input lead 82a and an output lead 83a in a state in which a power supply voltage Vcc is supplied. In other words, the CMR is defined by the voltage slope (kV/µs) of the maximum pulse voltage $V_{CM}$ for which the change of the output voltage Vo is not more than a prescribed value. For example, in the case where the electromagnetic shield film 24 has a thickness of 21 nm, a CMR that is 10 kV/μs or more is possible.

Figure 6:
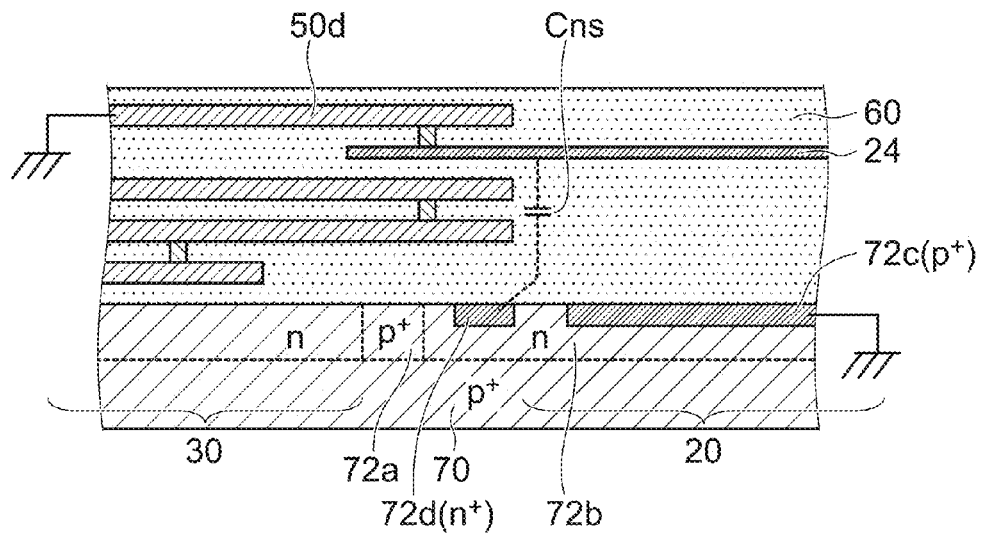
FIG. 6 is a schematic cross-sectional view of a light receiving element according to a second embodiment.

FIG. 6 is a schematic cross-sectional view of a light receiving element according to a second embodiment.

The electromagnetic shield film 24 that is made of the TiN thin film, etc., is connected to the output lead (the grounding side) 83a of the optically coupled insulating device via the metal interconnect layer 50d. Also, one terminal of the light receiving unit 20 and the grounding terminal of the signal processing circuit unit 30 are connected to the output lead 83a. For example, the input terminal of the TIA amplifier 32 that is provided in the front end of the light receiving element 10 as shown in FIG. 5A is connected to the other terminal of the light receiving unit 20.

In FIG. 6, the insulating layer 60 is interposed and a stray capacitance Cns occurs between the electromagnetic shield film 24 and the cathode (the n-type diffusion layer) of the photodiode included in the light receiving unit 20. The stray capacitance Cns is unfavorable because the stray capacitance Cns increases the capacitance of the input terminal of the TIA amplifier 32 and causes the frequency characteristics and/or the noise characteristics to degrade. Therefore, it is favorable for the distance between the electromagnetic shield film 24 and the semiconductor layer 72 to be long. For example, the distance is set to be 1 μm or more. In FIG. 6, the stray capacitance Cns is reduced by providing the electromagnetic shield film 24 at a position between the metal interconnect layer 50d, which is the uppermost layer, and the metal interconnect layer that is adjacent to the metal interconnect layer 50d.

The misoperations of the optically coupled insulating device 80 for which the electromagnetic shield effect is increased by the electromagnetic shield film 24 can be reduced further by the signal processing circuit unit 30 being a differential circuit unit.

Figure 7:
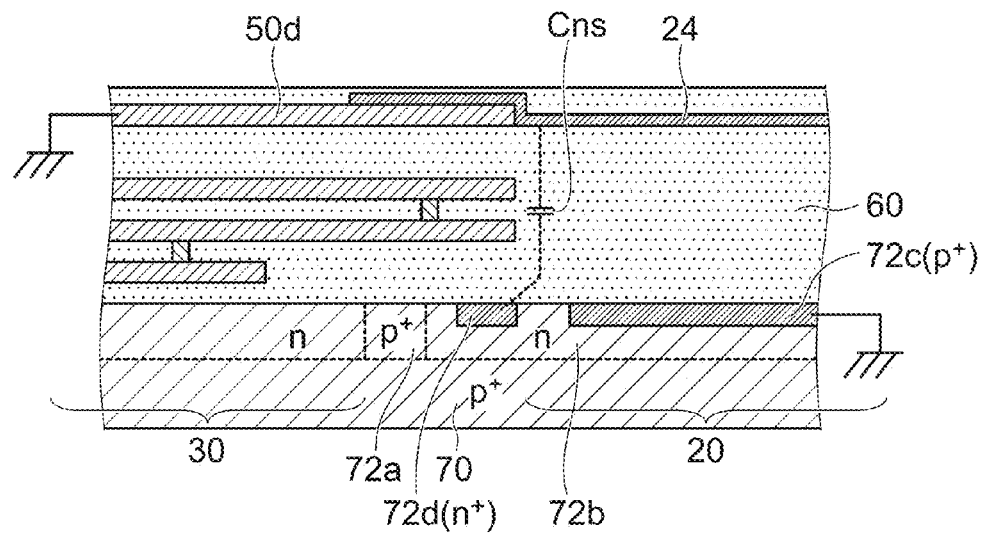
FIG. 7 is a schematic cross-sectional view of a modification of the light receiving element of the second embodiment.

FIG. 7 is a schematic cross-sectional view of a modification of the light receiving element of the second embodiment.

The electromagnetic shield film 24 that is made of TiN, etc., is connected to the upper surface of a top layer of the plurality of interconnect layers 50 by contacting the top layer. The top layer is a most distal layer of the plurality of interconnect layers 50 to the semiconductor layer. Therefore, it is unnecessary to provide a through-hole between the metal interconnect layer 50d and the electromagnetic shield film 24 in the interior of the insulating layer 60; and the stray capacitance Cns can be reduced. The substrate of the light receiving element 10 is not limited to the p-type substrate and may be an n-type substrate. Also, the metal interconnect layers 50 may be a metal such as Al, Cu, Ti, etc.

Figure 8A:
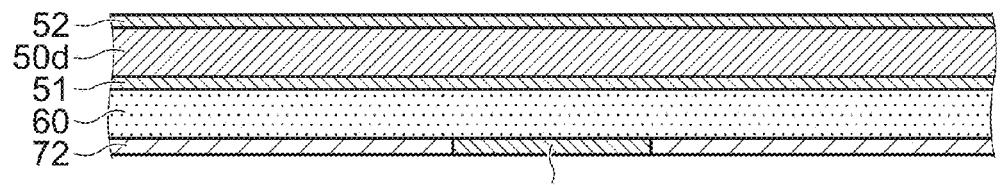
FIGS. 8A to 8F are schematic views showing manufacturing processes of the electromagnetic shield film 24 including the metal nitride thin film.
Figure 8B:
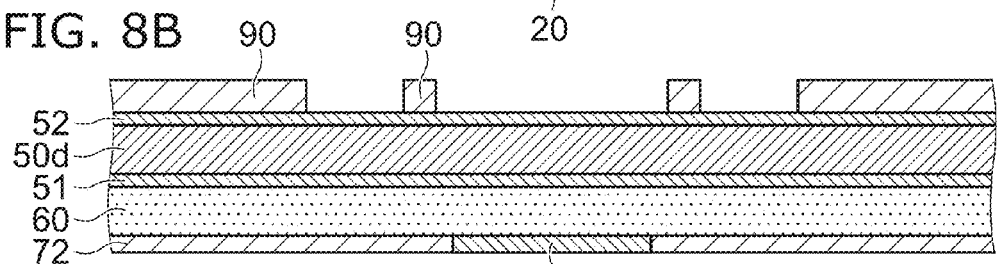
Figure 8C:
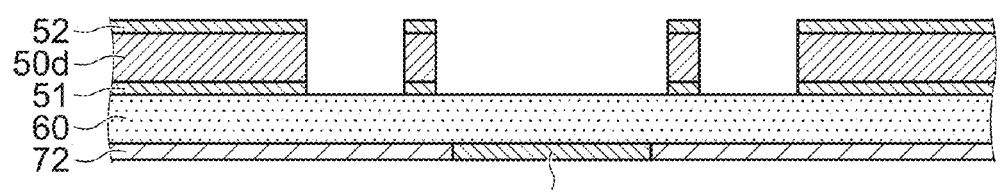
Figure 8D:
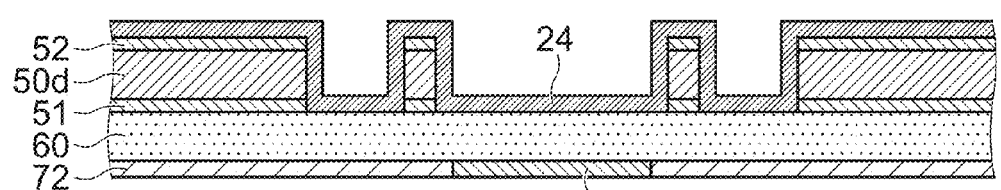
Figure 8E:
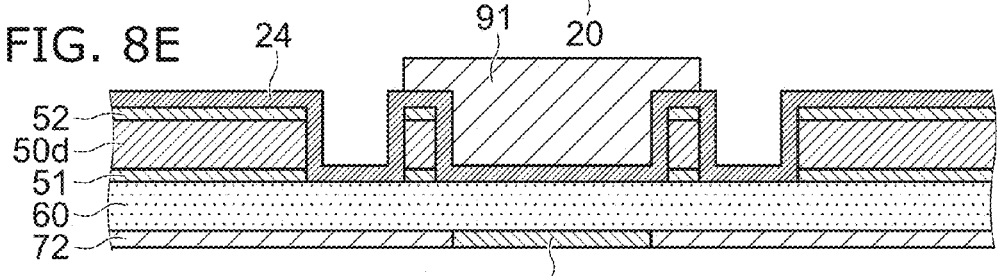
Figure 8F:
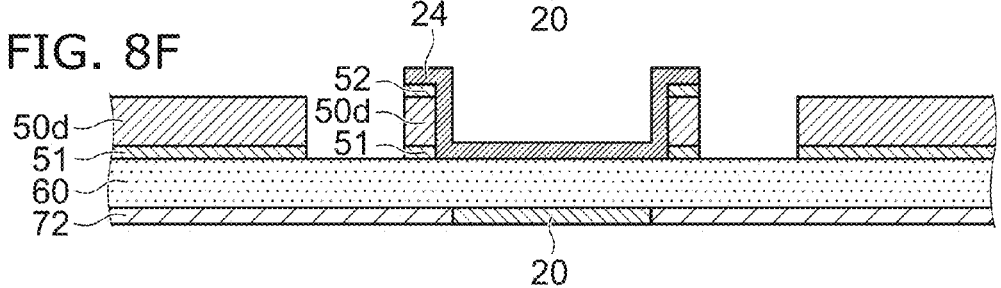

FIGS. 8A to 8F are schematic views showing manufacturing processes of the electromagnetic shield film 24 including the metal nitride thin film. Namely, FIG. 8A shows the metal interconnect layer 50d of the uppermost layer of the multiple metal interconnect layers. In FIGS. 8A to 8F, the metal interconnect layers that are positioned between the semiconductor layer and the metal interconnect layer 50d which is the uppermost layer are not shown. FIG. 8B is a schematic cross-sectional view of a structure in which a photoresist 90 is patterned; FIG. 8C is a schematic cross-sectional view of a structure in which the metal interconnect layer is selectively removed; FIG. 8D is a schematic cross-sectional view of a structure in which a metal nitride thin film is provided; FIG. 8E is a schematic cross-sectional view of a structure in which a photoresist 91 is patterned; and FIG. 8F is a schematic cross-sectional view of a structure in which the metal nitride thin film is removed from the outer region of the light receiving unit.

In these drawings, the electromagnetic shield film 24 is TiN. Although the electromagnetic shield film 24 is provided on the metal interconnect layer 50d of the uppermost layer to contact the metal interconnect layer 50d of the uppermost layer, it is unnecessary for the layer contacted by the electromagnetic shield film 24 to be the uppermost layer.

As shown in FIG. 8A, the metal interconnect layer 50d is formed above the semiconductor layer 72 in which the light receiving unit 20 and the signal processing circuit unit 30 are provided. Thin barrier layers 51 and 52 are provided on two sides of the metal interconnect layer 50d. In the case where the metal interconnect layers 50 are Al (e.g., having thicknesses of 200 to 1500 nm), the barrier layers 51 and 52 may be TiN (e.g., having thicknesses of 10 to 30 nm). The barrier layer 51 can suppress migration of the metal interconnect layer 50d; and the barrier layer 52 can prevent reflections in the exposure process.

As shown in FIG. 8B, the photoresist 90 is patterned to make openings to at least the upper portion of the front surface of the light receiving unit 20. Continuing as shown in FIG. 8C, at least the metal interconnect layer 50d and the barrier layers 51 and 52 on the two sides of the metal interconnect layer 50d above the light receiving unit 20 are removed; and the photoresist 90 also is removed. In these drawings, a portion of the metal interconnect layer 50d and the barrier layer 52 in the region around the light receiving unit 20 also is removed.

Then, as shown in FIG. 8D, the electromagnetic shield (TiN) film 24 having a thickness of 4 to 20 nm, etc., is formed on a portion of the barrier layer 52 on the metal interconnect layer 50d and above the light receiving unit 20 by sputtering, etc. The insulating layer 60 may remain above the light receiving unit 20.

Continuing as shown in FIG. 8E, the photoresist 91 is patterned to cover the region above the light receiving unit 20. The structure of FIG. 8F is obtained by removing the electromagnetic shield (TiN) film 24 that is in the region not covered with the photoresist 91 by RIE (Reactive Ion Etching), etc., and by further removing the photoresist 91. The electromagnetic shield film 24 that is above the light receiving unit 20 is connected to the metal interconnect layer 50d via the barrier layer 52 remaining at the end portion vicinity of the light receiving unit 20. It is possible to improve the suitability for mass production of the light receiving element 10 because the electromagnetic shield film 24 including TiN is used as the barrier layer of the semiconductor device, etc.

FIGS. 9A to 9F are schematic views showing a modification of the manufacturing processes of the electromagnetic shield film including the metal nitride thin film. Namely, FIG. 9A is a schematic cross-sectional view of a structure in which a first metal interconnect layer is provided above the semiconductor layer; FIG. 9B is a schematic cross-sectional view of a structure in which the photoresist 90 is patterned; FIG. 9C is a schematic cross-sectional view of a structure in which the metal interconnect layer 50d is selectively removed; FIG. 9D is a schematic cross-sectional view of a structure in which an electromagnetic shield film is provided; FIG. 9E is a schematic cross-sectional view of a structure in which the photoresist 91 is patterned; and FIG. 9F is a schematic cross-sectional view of a structure in which the electromagnetic shield film 24 is selectively removed. Similarly to FIGS. 8A to 8F, the metal interconnect layers that are positioned between the semiconductor layer and the metal interconnect layer 50d which is the uppermost layer are not shown. Further, the metal interconnect layer is not limited to being the uppermost layer.

In the case where the electromagnetic shield film 24 that is made of TiN is removed by RIE, etc., the upper portion of the metal interconnect layer 50d and the barrier layer 52 under the TiN may be removed with the TiN. By patterning the photoresist 91 in the modification as shown in FIG. 9E, the metal interconnect layer 50d, the barrier layers 51 and 52, and the TiN are etched by a continuous process using the same photoresist pattern. Therefore, a portion of the metal interconnect layer 50d and the barrier layer 52 is not removed and can be used as the metal interconnect layer.

Because there is no process to form the TiN thin film on the side surface of the metal interconnect layer 50d, the TiN thin film is not provided on the side surface of the metal interconnect layer 50d to be irradiated with the ion beam used in the RIE. Therefore, the yield decrease due to dust made of the TiN, etc., peeling from the side surface and soiling the interior of the RIE apparatus is suppressed.

According to the embodiment, a light receiving element is provided in which the effects of the noise are reduced and the suitability for mass production is good. According to the optically coupled insulating device including the light receiving element, for example, it is easy for the CMR to be 1 kV/μs or more and for misoperations to be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A light receiving element, comprising:
    a semiconductor layer including a light receiving unit configured to convert a signal light incident on the light receiving unit into an electrical signal;
    an insulating layer provided on the semiconductor layer;
    an interconnect layer provided on the insulating layer;
    a film located within the insulating layer to cover the light receiving unit and be connected to the interconnect layer, the film being made of a metal nitride including at least one selected from TiN, TaN, ZrN, VN, and NbN; and
    a lead electrically connected to the film.

2. The element according to claim 1, wherein the interconnect layer includes a plurality of layers, the insulating layer being provided between the plurality of layers.

3. The element according to claim 2, wherein the plurality of layers are connected at a prescribed location.

4. The element according to claim 2, wherein the film is connected to an upper surface of a top layer of the plurality of layers.

5. The element according to claim 4, wherein the film is provided to contact a portion of the upper surface of the top layer.

6. The element according to claim 2, wherein the film is provided to contact at least one of the plurality of layers.

7. The element according to claim 1, wherein
    the light receiving unit includes an anode and a cathode, and
    the film is connected to the anode or the cathode via the interconnect layer.

8. The element according to claim 1, wherein
    the semiconductor layer further includes a signal processing circuit unit connected to the light receiving unit to process and output the electrical signal, and
    the film is connected to a ground of the signal processing circuit unit via the interconnect layer.

9. The element according to claim 1, wherein the film is made of TiN and has a thickness of not more than 21 nm.

10. An optically coupled insulating device, comprising:
    a light receiving element including a semiconductor layer, an insulating layer, an interconnect layer, and a film, the semiconductor layer including a light receiving unit configured to convert a signal light incident on the light receiving unit into an electrical signal, the insulating layer being provided on the semiconductor layer, the interconnect layer being provided on the insulating layer, the film being located within the insulating layer to cover the light receiving unit and be connected to the interconnect layer, the film being made of a metal nitride including at least one selected from TiN, TaN, ZrN, VN, and NbN;
    a light emitting element configured to irradiate the signal light toward the light receiving unit;
    a signal input unit, the light emitting element being provided on the signal input unit;
    an output unit insulated from the signal input unit, the light receiving element being provided on the output unit;
    an input lead electrically connected to the light emitting element; and
    an output lead electrically connected to the light receiving element.

11. The device according to claim 10, wherein the film is made of TiN and has a thickness of not more than 21 nm.

* * * * *